United States Patent
Dauphinee et al.

(10) Patent No.: US 7,408,407 B2
(45) Date of Patent: Aug. 5, 2008

(54) LOW NOISE VARIABLE GAIN AMPLIFIER

(75) Inventors: Leonard Dauphinee, Irvine, CA (US); Ramon A. Gomez, San Juan Capistrano, CA (US)

(73) Assignee: Broadcom Corporation, Irvine, CA (US)

( * ) Notice: Subject to any disclaimer, the term of this patent is extended or adjusted under 35 U.S.C. 154(b) by 74 days.

(21) Appl. No.: 11/321,650

(22) Filed: Dec. 30, 2005

(65) Prior Publication Data

US 2006/0164162 A1   Jul. 27, 2006

Related U.S. Application Data

(60) Provisional application No. 60/639,961, filed on Dec. 30, 2004.

(51) Int. Cl.
*H03G 3/00* (2006.01)
*H03G 3/20* (2006.01)

(52) U.S. Cl. .................................. 330/141; 330/278
(58) Field of Classification Search .................. None
See application file for complete search history.

(56) References Cited

U.S. PATENT DOCUMENTS

| | | | |
|---|---|---|---|
| 6,798,286 B2 * | 9/2004 | Dauphinee et al. | 330/129 |
| 7,068,100 B2 * | 6/2006 | Dauphinee et al. | 330/129 |
| 7,183,845 B2 * | 2/2007 | Dauphinee et al. | 330/129 |
| 7,215,933 B1 * | 5/2007 | Tse et al. | 455/127.2 |

* cited by examiner

*Primary Examiner*—Robert J. Pascal
*Assistant Examiner*—Krista M Flanagan
(74) *Attorney, Agent, or Firm*—Sterne Kessler Goldstein & Fox, p.l.l.c.

(57) ABSTRACT

The present invention provides systems and methods for asymmetrically varying gain in a low noise amplifier. The amplifier includes a first stage amplifier, a plurality of second stage amplifiers coupled to the first stage amplifier, a comparator coupled to one of the second stage amplifiers, and a controller coupled to the comparator, the first stage amplifier, and the plurality of second stage amplifiers. The controller is configured to produce one or more gain control signals to change the gain of one of the first stage amplifier or the plurality of second stage amplifiers at a plurality of asymmetric rates so as to cause the power of the output signal to move toward one of the threshold values of the comparator. The rate of change of the gain is based on conditions including the gain of the first stage amplifier, gain of a second stage amplifier, and the sampled power level.

16 Claims, 6 Drawing Sheets

LOW NOISE VARIABLE GAIN AMPLIFIER

CROSS REFERENCE TO RELATED APPLICATIONS

This application claims the benefit of U.S. Provisional Patent Application No. 60/639,961, filed Dec. 30, 2004, which is incorporated herein by reference in its entirety.

FIELD OF THE INVENTION

The present invention generally relates to low noise amplifiers (LNA) assemblies and components thereof, gain control in such assemblies, and applications of the same.

BACKGROUND

In terrestrial digital television (DTV) applications, the received signal is not always direct. For example, the received DTV signal may be reflected by objects, geographic features (e.g., mountains), or may be affected by weather conditions. As a result, unlike cable TV signals, DTV signals are subject to large drops in the received signals, referred to as fading.

In addition, DTV low noise amplifiers typically have requirements that exceed the requirements of cable TV low noise amplifiers. For example, a DTV low noise amplifier typically requires more gain, a lower noise figure, and needs to handle relatively strong adjacent channels. Off-air DTV signals can vary widely in terms of received power level and can come in quite strongly. In some cases, the desired channel is very weak, and can have a very strong adjacent channel, for example, at a level of 40-50 dB stronger than the desired signal.

Accordingly, what is needed is an amplifier that can rapidly adapt to signals with large amounts of fading.

What is further needed is a system that can selectively respond faster or slower to a detected power level and achieve a linear type of response while still providing benefits of digital gain control for downstream power management.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

Figure 1:
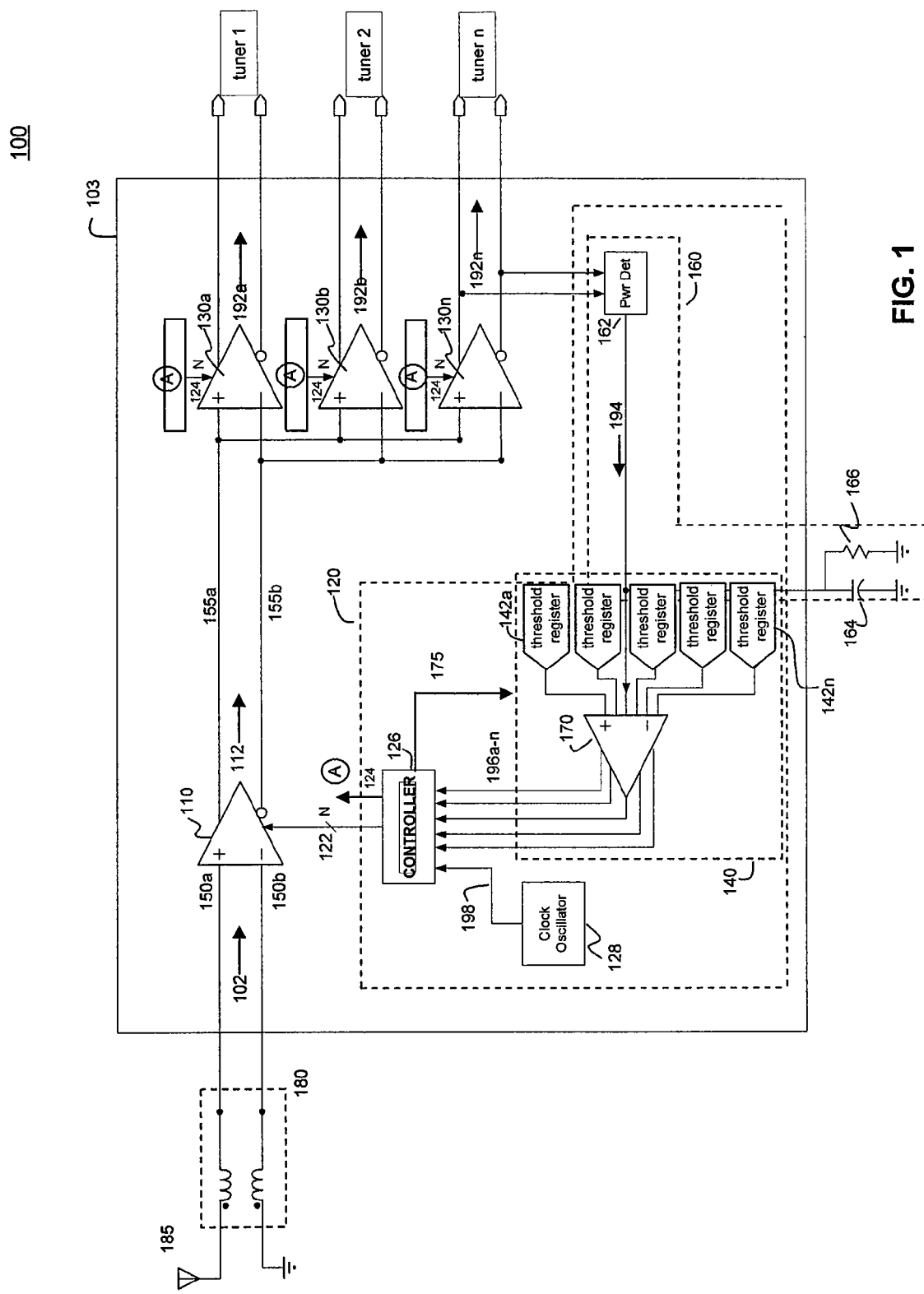
FIG. 1 is a block diagram of an exemplary low noise amplifier, according to an embodiment of the present invention.

The present invention will now be described with reference to the accompanying drawings. In the drawings, like reference numbers can indicate identical or functionally similar elements. Additionally, the left-most digit(s) of a reference number may identify the drawing in which the reference number first appears.

DETAILED DESCRIPTION OF THE INVENTION

1.0 Overview

Low noise amplifiers often include a two-stage amplifier with a first stage having a relatively higher, variable, gain than one or more second stage amplifiers. A power detector coupled to an output of the DTV low noise amplifier drives an automatic gain control (AGC) circuit, which sets the gain of the low noise amplifier to maintain a fixed output level. The AGC level can be set to a range of values by a digital interface circuit. In an exemplary embodiment, the first stage amplifier provides a variable gain of, for example, 15 dB and the second stage amplifier provides a variable gain of, for example, 12 dB. In this example, the system has a total gain of approximately 27 dB, and an AGC range of approximately 50 dB. As would be appreciated by persons of skill in the art, other gains could be used for the first and second stage amplifiers.

2.0 Structural Embodiments of the Present Invention

FIG. 1 is a block diagram of an exemplary low noise amplifier 100. Low noise amplifier 100 and/or portions thereof can be used in cable television applications (e.g., NTSC, digital TV and/or cable modem) or in terrestrial analog (NTSC) or digital television (DTV) applications. When implemented in a DTV application, the present invention is referred to herein as a DTV low noise amplifier. Low noise amplifier 100, or portions thereof, can also be used as a variable gain low noise amplifier for an off-air DTV receiver.

Low noise amplifier 100 includes a first stage variable gain amplifier 110, a gain control module 120, and a plurality of second stage amplifiers 130a-n constructed on an integrated circuit (IC) substrate or chip 103. Low noise amplifier 100 also includes various additional elements internal or external to chip 103.

First stage variable gain amplifier 110 is coupled to gain control module 120 and to the plurality of second stage amplifiers 130a-n. First stage variable gain amplifier 110 is a differential amplifier having differential inputs and differential outputs. First stage amplifier 110 receives input signal 102 over differential signal lines 150a and 150b. Amplifier 100 receives the input signal via an antenna (e.g., antenna 185 depicted in FIG. 1) or a cable (not shown). The received signal is then fed through an optional balun 180 to produce differential signal 102. Antenna 185, cable input (not shown), and balun 180 are off-chip.

In addition, first stage amplifier 110 receives a plurality of gain control signals 122 from controller 126. First stage amplifier 110 amplifies input signal 102 according to the gain of the first stage amplifier which is determined by the received gain control signals 122. Amplifier 110 then produces an amplified signal 112 and transmits amplified signal 112 via differential signal lines 155a and 155b to the plurality of second stage amplifiers 130a-n. Second stage amplifiers 130a-n are arranged such that each amplifier 130 receives signal 112 in parallel and at the respective differential inputs of each second stage amplifier 130a-n.

First stage amplifier 110 is an impedance matched variable gain low noise amplifier using shunt feedback. For a detailed description of an impedance matched variable gain low noise amplifier using shunt feedback, see U.S. Provisional Patent Application No. 60/635,174, entitled "Impedance Matched Variable Gain Low Noise Amplifier", which is herein incorporated by reference in its entirety.

Each second stage amplifier 130 also has a programmable gain. Thus, second stage amplifiers 130*a-n* are also variable gain amplifiers. Each second stage amplifier 130 is coupled to controller 126. Each second stage amplifier 130 amplifies signal 112 by its respective gain to produce an output signal 192. Second stage amplifiers 130*a-n* are differential amplifiers. Thus, output signal 192 is a differential signal.

Gain control module 120 is coupled between the output of one of the plurality of second stage amplifiers 130 (e.g., amplifier 130*n*) and first stage amplifier 110. Gain control module 120 includes a power detector 160, a comparator module 140, controller module 126, and a clock oscillator 128.

Power detector 160 includes a power detection module 162, a capacitor 164, and an optional resistor 166. Capacitor 164 and optional resistor 166 may be located off-chip. Capacitor 164 and resistor 166 are coupled between the output of power detection module 162 and ground. Power detection module 162 receives differential output signal 192 from one of the plurality of second stage amplifiers 130 (e.g., output signal 192*n*). Power detector 160 is configured to detect the power level of received output signal 192 and to communicate the detected power level to comparator module 140 via a signal 194. As would be appreciated by persons of skill in the art, other methods to detector the power level can be used with the present invention.

Comparator module 140 includes a window comparator 170 and a plurality of threshold registers 142*a-n*. Threshold registers 142*a-n* provide the thresholds against which the detected power level is compared. In an embodiment, threshold registers 142*a-n* are digital to analog converters (DACs).

Comparator 170 receives detected power level signal 194 at a comparison input. Comparator 170 then compares power level signal 194 against the plurality of thresholds to produce comparison signals 196*a-n*. Comparison signals 196*a-n* indicates where the detected power of output signal 192 is relative to the plurality of thresholds of threshold registers 142*a-n*. Thus, low noise amplifier 100 uses multiple levels of quantization. This allows the low noise amplifier to respond to changes in the signal level at multiple rates. These rates can be asymmetrically or symmetrically related to the power level signal 194.

In an embodiment, the output of comparator 170 is an n-level thermometer code. For example, when window comparator 170 includes five comparators, output signals 196*a-n* represent a six level thermometer code. However, as would be appreciated by persons of ordinary skill in the relevant art, more comparators could be used in window comparator to produce a higher number of thermometer codes or the power detector output signal could be digitized to even more levels with binary code. This produces greater flexibility and adaptability to the gain control response at the expense of additional circuitry and power consumption. The use of five or more comparators provides an increased ability to respond to signal fading. Two specific benefits result from using multiple comparators. One is that the gain may be caused to change faster in response to larger errors in output signal amplitude (larger in magnitude, whether the signal is too weak or too strong).

The other is asymmetrical response for signals that are too strong versus too weak. This may be desirable so that the AGC adapts to either the maximum or minimum of the fade (typically the maximum), thus preventing picture disturbances in response to AGC activity.

Controller 126 receives comparison signals 196*a-n* and a clock signal 198 generated by clock oscillator 128. Controller 126 then generates a set of gain control signals 122 and 124. Gain control signals 122 are configured to set the gain of first stage amplifier 110. Gain control signals 124 are configured to set the gains of second stage amplifiers 130*a-n*. In addition, controller 126 provides a comparator control signal 175 to comparator 170. At periodic intervals, controller 126 asserts comparator control signal 175 causing comparator 170 to produce comparison signal 196. The periodic time intervals may be programmable in duration and correspond to the rate at which the power level of input signal 102 is expected to vary. Controller 126 may also provide threshold values to threshold registers 142*a-n*. Controller 126 is optionally connected to an external controller (not shown).

Amplifier 100 may include an optional decoder and switch matrix (not shown) between controller 126 and amplifier 110. For a more detailed discussion of a decoder and switch matrix, see U.S. patent application Ser. No. 10/822,729, entitled "Gain Control Methods and Systems in an Amplifier Assembly," which is herein incorporated by reference in its entirety.

Figure 2:
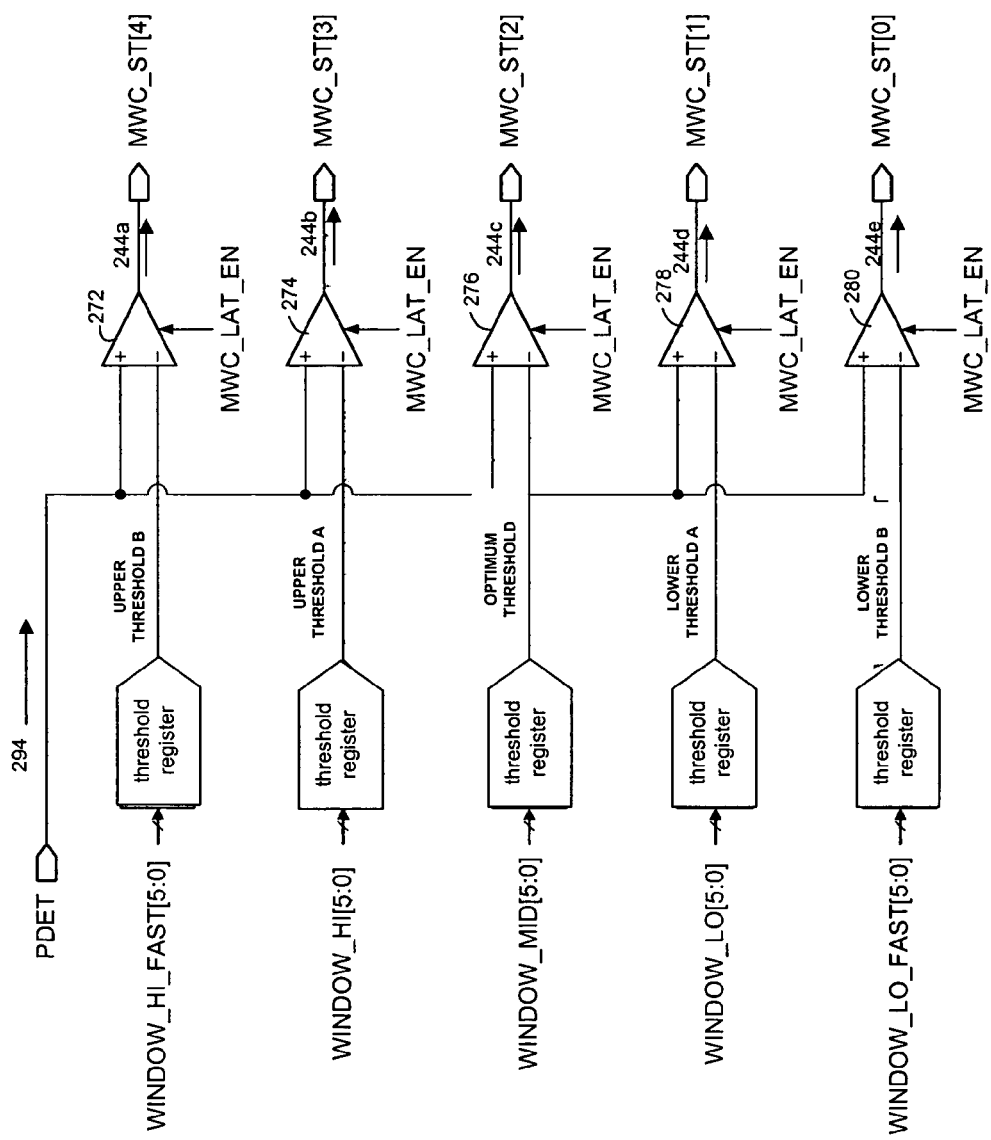
FIG. 2 is a block diagram of an exemplary window comparator.

FIG. 2 is a block diagram of an exemplary window comparator 270. In the embodiment of FIG. 2, window comparator 270 includes five threshold comparators. However, additional comparators can be used with the present invention.

Comparator 270 includes first upper threshold comparator 272 for comparing power level signal 294 to upper threshold B. First upper threshold comparator 272 produces a result 244*a* indicative of whether detected power level signal 294 is higher or lower than upper threshold B. Comparator 270 includes a second upper threshold comparator 274 for comparing power level signal 294 to upper threshold A. Second upper threshold comparator 274 produces a result 244*b* indicative of whether detected power level signal 294 is higher or lower than upper threshold A. Comparator 270 includes an optimum threshold comparator 276 for comparing power level signal 294 to an optimum threshold. Optimum threshold comparator 276 produces a result 244*c* indicative of whether detected power level signal 294 is higher or lower than the optimum threshold. Comparator 270 includes a first lower threshold comparator 280 for comparing power level signal 294 to lower threshold B. First lower threshold comparator 280 produces a result 244*e* indicative of whether detected power level signal 294 is higher or lower than lower threshold B. Comparator 270 includes a second lower threshold comparator 278 for comparing power level signal 294 to lower threshold A. Second lower threshold comparator 278 produces a result 244*d* indicative of whether detected power level signal 294 is higher or lower than lower threshold A.

Figure 3:
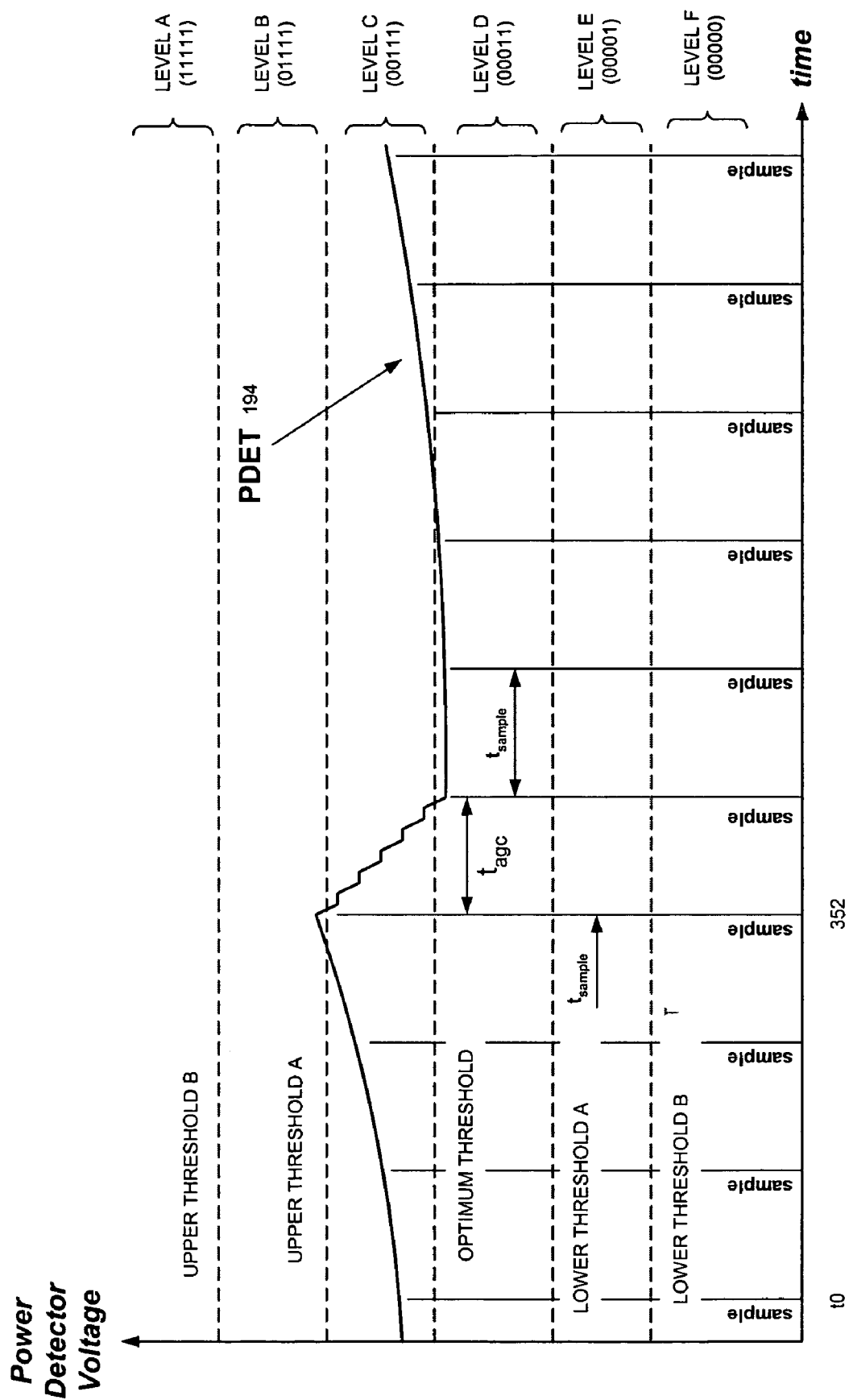
FIG. 3 is an example plot of detected power signal versus time for an exemplary amplifier having a five level comparator.

FIG. 3 is an example plot of detected power signal 194 versus time for an exemplary amplifier having a five level comparator, such as depicted in FIG. 2. The example plot of FIG. 3 serves as a useful illustration of the operation of first stage amplifier 104 with respect to detected power signal 194 and thresholds 244*a-e*. In the example illustrated in FIG. 3, six levels (or ranges) are created by comparator 270.

For example, when the detected power signal is above upper limit B (i.e., in level A), the thermometer code output 196 of the comparator is 11111. When the detected power signal is between upper limit B and upper limit A (i.e., in level B), the output 196 of the comparator is 01111. When the detected power signal is between optimum threshold and upper limit A (i.e., in level C), the output 196 of the comparator is 00111. When the detected power signal is between the optimum threshold and lower limit A (i.e., in level D), the output 196 of comparator 270 is 00011. When the detected power signal is between lower limit A and lower limit B (i.e., in level E), the output 196 of comparator 270 is 00001. When the detected power signal is below lower limit B (i.e., in level F), the output 196 of comparator 270 is 00000.

An initial assumption is that at a time to, the power of input signal 102, the gain of amplifier 110, and the resulting power of signal 192 are such that detected power level 194 is in level C (i.e., between optimum threshold and upper limit A), as depicted in FIG. 3. It is also assumed that at periodic time intervals, controller 126 samples comparison signal 196. Beginning at time to, a slow increase in the power of input signal 102 causes a correspondingly slow increase in output signal 192 and detected power level signal 194. Controller 126 maintains the gain of amplifier 104 at a fixed level. Eventually, power level signal 194 rises to a level between upper threshold A and upper threshold B. At the next sample time 352, comparator 270 transmits code 01111 to indicate that the power level is now in level B. In response, controller 126 generates gain control signals to decrease the gain of amplifier 110 continuously and smoothly and correspondingly detected power level signal 194 decreases until the power level signal passes below the optimum threshold.

3.0 Method of Operation

Figure 4:
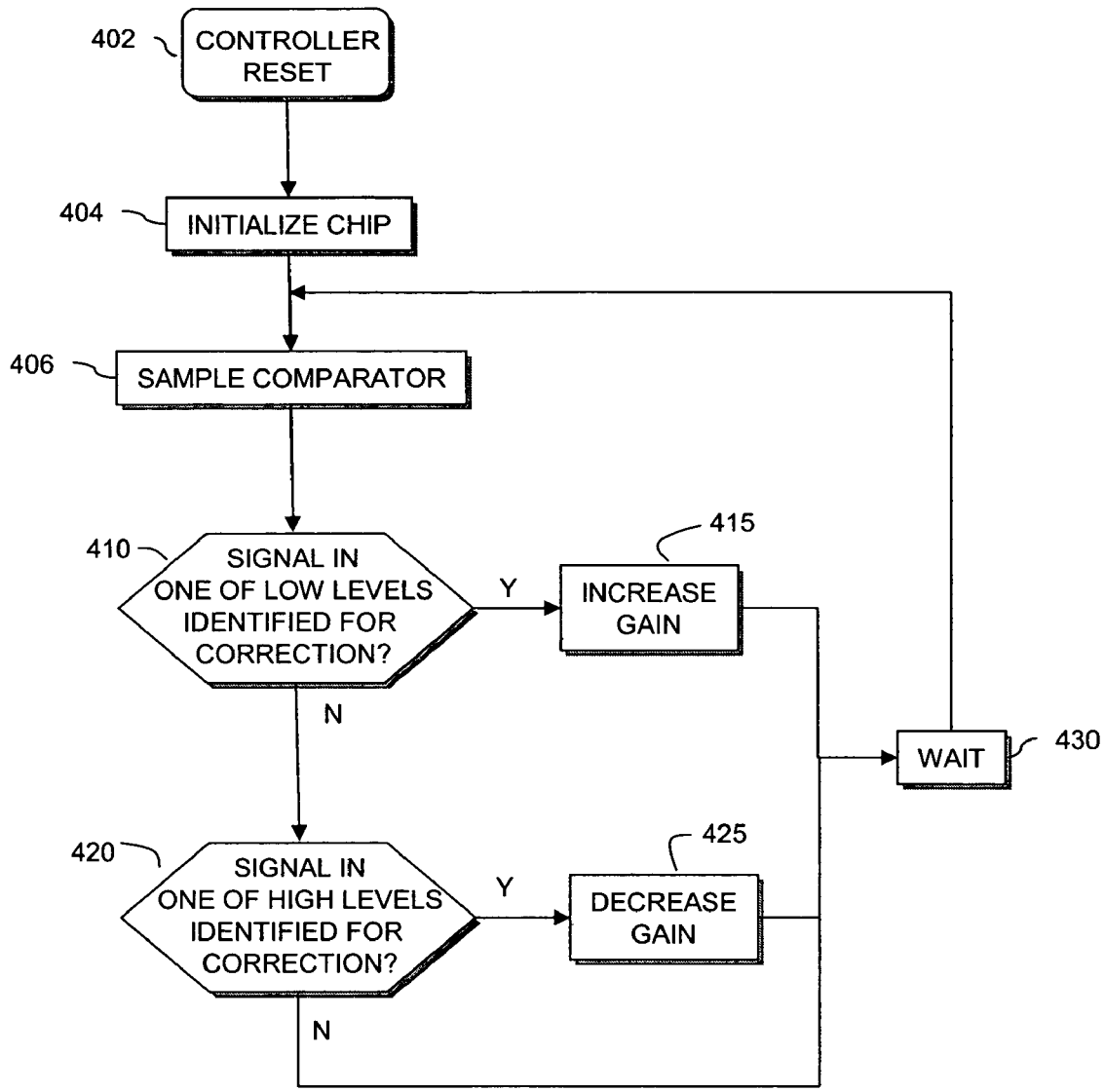
FIG. 4 is a flowchart of an example method in a controller for controlling the gain of a first stage amplifier and the gains of a plurality of second stage amplifiers.

FIG. 4 is a flowchart of an example method 400 in controller 126 for controlling the gain of the first stage amplifier 110 and the gains of the plurality of second stage amplifiers 130. Method 400 begins at step 402 when controller 126 is reset.

In step 404, controller 126 initializes the chip.

In step 406, controller 126 samples comparator 170. This step involves polling comparator 170 (e.g., sending comparator control signal 175), causing comparator 170 to transmit comparison signal 196.

In step 410, a determination is made whether the received comparison signal 196 indicates that the detected power level is in one of the low levels identified for correction. As described above, the number of levels available is based on the number of comparators used in window comparator 170. For example, when the window comparator has five comparators, six levels are available. One or more of the levels are identified as low levels needing correction. For example, in FIG. 3., levels E (00001) and F (00000) may be identified as levels where correction is necessary. If the detected power level is in one of the low levels identified for correction, the operation proceeds to step 415. If the detected power level is not in one of the low levels identified for correction, the operation proceeds to step 420.

In step 420, a determination is made whether the received comparison signal 196 indicates that the detected power level is in one of the high levels identified for correction. One or more of the levels are identified as high levels needing correction. For example, in FIG. 3., levels A (11111) and B (01111) may be identified as levels where correction is necessary. If the detected power level is in one of the high levels identified for correction, operation proceeds to step 425. If the detected power level is not in one of the high levels identified for correction, operation proceeds to step 430.

In step 415, the gain of the low noise amplifier is increased. In this step, the gain is increased at one of a plurality of rates. The rate of increase is determined based on one or more of the following: the gain of the stage one amplifier, the detected power level, and/or the gain of the stage 2 amplifier. Step 415 is described in greater detail below in reference to FIG. 5.

In step 425, the gain of the low noise amplifier is decreased. In this step, the gain is decreased at one of a plurality of rates. The rate of decrease is determined based one or more of the following: the gain of the stage one amplifier, the detected power level, and/or the gain of the stage 2 amplifier. Step 425 is described in greater detail below in reference to FIG. 6.

In step 430, the controller waits a period of time. At the end of this period, operation returns to step 406. The wait period may be programmable.

Controller 126 can increase the gain in step 415 at the same rate at which the gain is decreased in step 425. In an alternate embodiment, the controller can increase and decrease the gain asymmetrically (e.g., at different rates). For example, controller 126 may increase gain at a faster rate that the gain is decreased. This causes the AGC of the low noise amplifier to behave more like a peak detector in response to fading.

Figure 5:
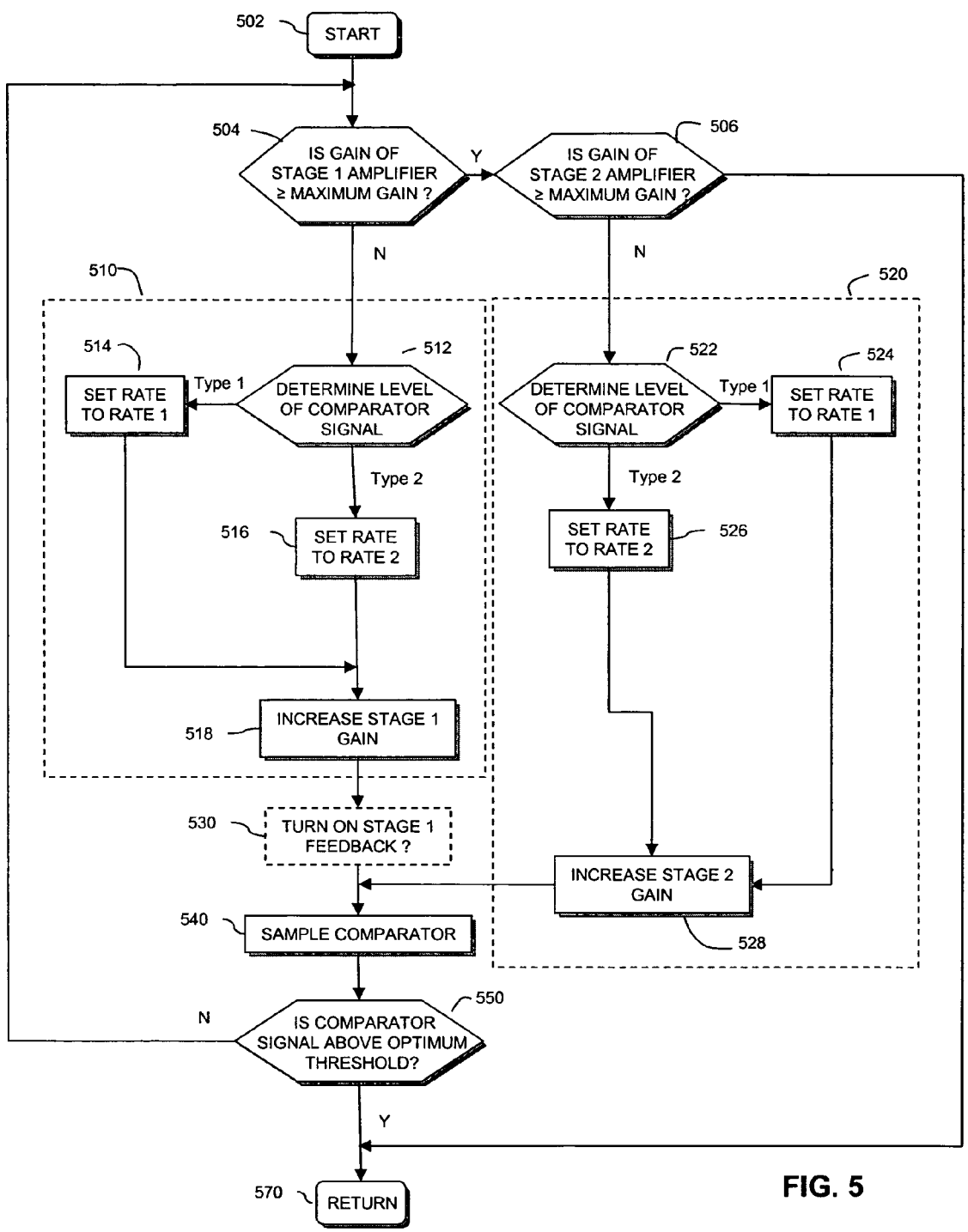
FIG. 5 is an example method in a controller for increasing gain.

FIG. 5 is an example method 500 in controller 126 for increasing gain (step 415). Method 500 begins at step 502.

In step 504, a determination is made whether the gain of first stage amplifier 110 is greater than or equal to the maximum gain of first stage amplifier 110. If the gain is not greater than or equal to the maximum gain, the operation proceeds to step 510. If the gain is greater than or equal to the maximum gain, the operation proceeds to step 506.

In step 510, the gain of first stage amplifier 110 is increased. The rate at which the gain is increased is determined based on the detected power level. Step 510 includes steps 512 through 518.

In step 512, a determination of the level of the received compensation signal 196 is made. If the signal is in a level identified for type 1 correction, operation proceeds to step 514. If the signal is in a level identified for type 2 correction, operation proceeds to step 516. For example, in FIG. 3, the level F (00000) is designated for type 2 correction. The remaining levels are then identified for type 1 correction.

In step 514, the rate for updating the gain is set to rate 1.

In step 516, the rate for updating the gain is set to rate 2. In an embodiment, rate 2 is faster than rate 1.

In step 518, the gain of stage 1 amplifier 110 is increased.

Although step 510 describes the use of two rates, a person of skill in the art will recognize that additional rates can be used based on the number of levels supported. For example, if four levels are designated increase gain processing, a separate rate can be assigned for each level. Thus, up to four rates can be used for increasing the gain.

In step 530, a determination is made whether feedback of first stage amplifier 110 is turned on. This step is optional and is only present if first stage amplifier has feedback capabilities.

In step 506, a determination is made whether the gain of second stage amplifier 110 is greater than or equal to the maximum gain of second stage amplifier 110. If the gain is not greater than or equal to the maximum gain, operation proceeds to step 520. If the gain is greater than or equal to the maximum gain, operation proceeds to step 570.

In step 520, the gain of the second stage amplifiers 130 is increased. The rate at which the gain is increased is determined based on the detected power level. Step 520 includes steps 522 through 528.

In step 522, a determination of the level of the received compensation signal 196 is made. If the signal is in a level identified for type 1 correction, operation proceeds to step 524. If the signal is in a level identified for type 2 correction, operation proceeds to step 526. For example, in FIG. 3, the level F (00000) is designated for type 2 correction. The remaining levels are then identified for type 1 correction.

In step 524, the rate for updating the gain is set to rate 1.

In step 526, the rate for updating the gain is set to rate 2, which may be faster than rate 1.

In step 528, the gain of the plurality of stage 2 amplifiers 130 is increased.

Although step 520 describes the use of two rates, a person of skill in the art will recognize that additional rates can be used based on the number of levels supported. In addition, step 520 may use the same rates as step 510 or different rates based on the needs of the application.

In step 540, the comparator is sampled.

In step 550, a determination is made whether comparison signal 196 is above the optimum threshold. If signal 196 is above the optimum threshold, operation proceeds to step 570. If signal 196 is not above the optimum threshold, operation returns to step 504.

In step 570, operation returns to step 430 of FIG. 4.

Figure 6:
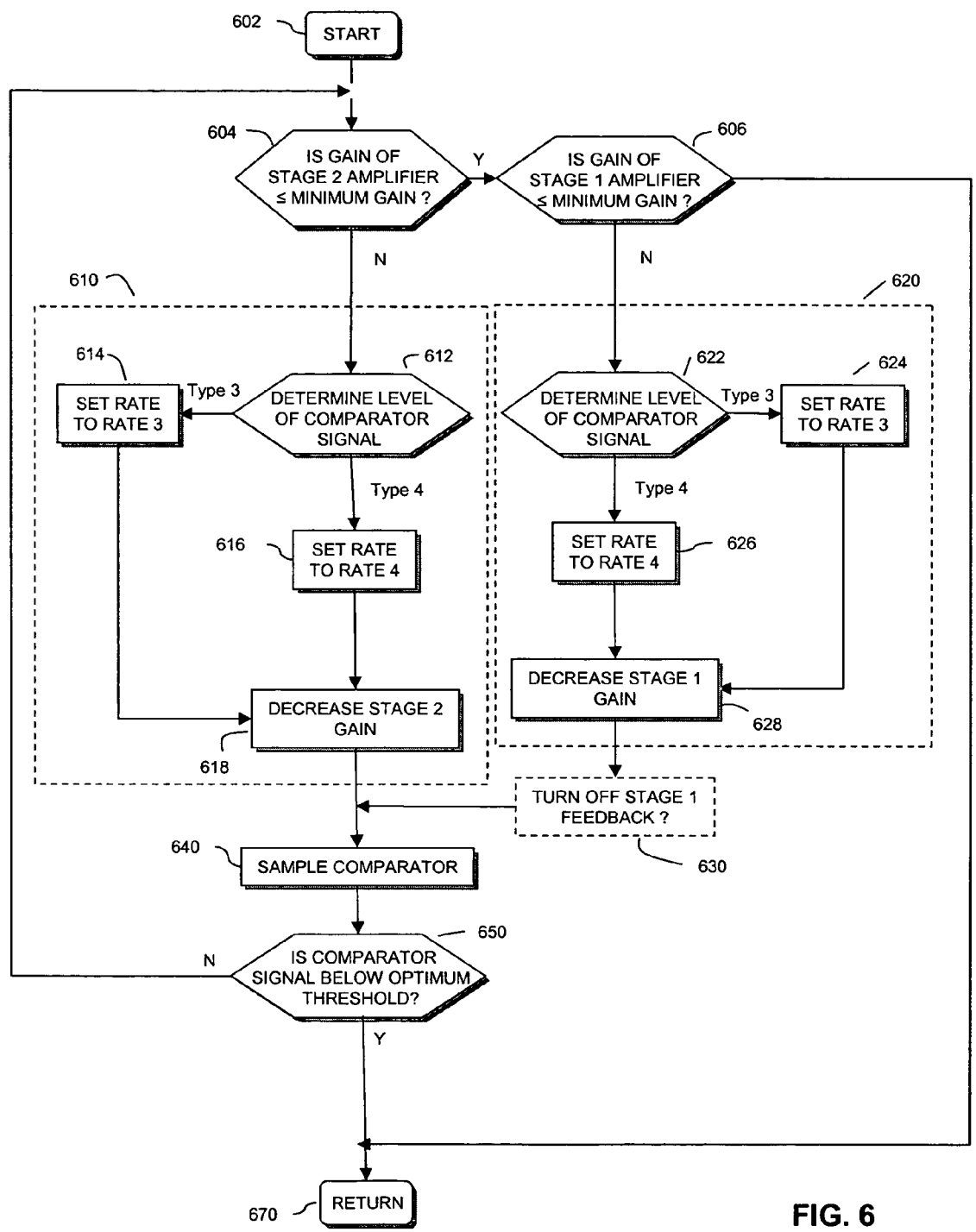
FIG. 6 is an example method in a controller for decreasing gain.

FIG. 6 is an example method 600 in controller 126 for decreasing gain (step 425). Method 600 begins at step 602.

In step 604, a determination is made whether the gain of the second stage amplifiers 130 is less than or equal to the minimum gain of the second stage amplifiers 130. If the gain is not less than or equal to the minimum gain, operation proceeds to step 610. If the gain is less than or equal to the minimum gain, operation proceeds to step 606.

In step 610, the gain of the second stage amplifiers 130 is decreased. The rate at which the gain is decreased is determined based on the detected power level. Step 610 includes steps 612 through 618.

In step 612, a determination of the level of the received compensation signal 196 is made. If the signal is in a level identified for type 3 correction, operation proceeds to step 614. If the signal is in a level identified for type 4 correction, operation proceeds to step 616. For example, in FIG. 3, level A (11111) is designated for type 4 correction. The remaining levels are designated for type 3 correction.

In step 614, the rate for updating the gain is set to rate 3.

In step 616, the rate for updating the gain is set to rate 4 which may be faster than rate 3.

As described above, rates 1 and 2 (for increasing the gain) can be equal to rates 3 and 4 (for decreasing the gain). Alternatively, rates 1 and 2 can be different than rates 3 and 4.

In step 618, the gain of the second stage amplifiers is decreased.

Although step 610 describes the use of two rates, a person of skill in the art will recognize that additional rates can be used based on the number of levels supported.

In step 606, a determination is made whether the gain of the first stage amplifier 110 is less than or equal to the minimum gain of the first stage amplifier 110. If the gain is not less than or equal to the minimum gain, the operation proceeds to step 620. If the gain is less than or equal to the minimum gain, the operation proceeds to step 670.

In step 620, the gain of the first stage amplifier 110 is decreased. The rate at which the gain is decreased is determined based on the detected power level. Step 620 includes steps 622 through 628.

In step 622, a determination of the level of the received compensation signal 196 is made. If the signal is in a level identified for type 3 correction, the operation proceeds to step 624. If the signal is in a level identified for type 4 correction, the operation proceeds to step 626. For example, in FIG. 3, level A (11111) is designated for type 4 correction. The remaining levels are designated for type 3 correction.

In step 624, the rate for updating the gain is set to rate 3.

In step 626, the rate for updating the gain is set to rate 4 which may be faster than rate 3.

In step 628, the gain of stage 1 amplifier 110 is decreased.

Although step 620 describes the use of two rates, a person of skill in the art will recognize that additional rates can be used based on the number of levels supported.

In step 630, a determination is made whether feedback of first stage amplifier 110 is turned off. This step is optional and is only present if first stage amplifier has feedback capabilities.

In step 640, the comparator is sampled.

In step 650, a determination is made whether comparison signal 196 is below the optimum threshold. If signal 196 is below the optimum threshold, operation proceeds to step 670. If signal 196 is not below the optimum threshold, operation returns to step 604.

In step 670, operation returns to step 430 of FIG. 4.

4.0 Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for varying gain in an amplifier, comprising:
   (a) defining a plurality of output level ranges, wherein each of the plurality of output level ranges are defined using a first threshold value and a second threshold value;
   (b) increasing the gain of the amplifier by a first rate when a power level for an output signal of the amplifier is within a first output level range; and
   (c) increasing the gain of the amplifier by a second rate when the power level for the output signal is within a second output level range, wherein the first rate is different than the second rate; and
   (d) decreasing the gain of the amplifier by a third rate when the power level for the output signal is within a third output level range.

2. The method of claim 1, further comprising the step of:
   prior to step (b), sampling the power level of an output signal of the amplifier.

3. The method of claim 1, wherein the first rate is different than the third rate.

4. The method of claim 2, further comprising:
   if the sampled power level is below an optimum threshold for the amplifier, repeating steps (b) and (c).

5. The method of claim 2, further comprising:
   if the sampled power level is above an optimum threshold for the amplifier, repeating step (d).

6. A method for varying gain in an amplifier, comprising:
   (a) sampling a power level of an output signal of the amplifier;
   (b) selecting a gain variation rate from a plurality of gain variation rates based on the sampled power level, wherein each gain variation rate is associated with a predefined output level range and wherein the plurality of gain variation rates includes at least two gain increase rates; and
   (c) varying the gain of the amplifier according to the selected gain variation rate.

7. The method of claim 6, wherein the amplifier includes a first stage amplifier coupled to a second stage amplifier, and wherein step (b) comprises:
   (i) selecting a first gain variation rate based on one or more conditions including a first sampled power level, a gain of the first stage amplifier, and a gain of the second stage amplifier; and (ii) selecting a second gain variation rate based on one or more conditions including a second sampled power level, a gain of the first stage amplifier, and a gain of the second stage amplifier.

8. The method of claim 7, wherein step (b)(i) comprises:
selecting the first gain variation rate if the sampled power level is within a range identified for a type 1 increase gain correction and the gain of the first stage amplifier is greater than or equal to a first predetermined value; and
selecting the first gain variation rate if the sampled power level is within a range identified for the type 1 increase gain correction, the gain of the first stage amplifier is below the first predetermined value, and the gain of the second stage amplifier is greater than or equal to a second predetermined value.

9. The method of claim 8, wherein step (b)(ii) comprises:
selecting the second gain variation rate if the sampled power level is within a range identified for a type 2 increase gain correction and the gain of the first stage amplifier is above or equal to a first predetermined value; and
selecting the second gain variation rate if the sampled power level is within a range identified for type 2 increase gain correction, the gain of the first stage amplifier is below the first predetermined value, and the gain of the second stage amplifier is above or equal to a second predetermined value.

10. The method of claim 9, wherein the first gain variation rate is different than the second gain variation rate.

11. The method of claim 6, further comprising:
(d) repeating steps (b) and (c) until the sampled power level falls within an optimal range.

12. An amplifier, comprising:
a first stage amplifier;
a plurality of second stage amplifiers, wherein each second stage amplifier is configured to receive an output of the first stage amplifier;
a comparator module coupled to one of the plurality of second stage amplifiers, wherein the comparator module is configured to compare a detected power of an output signal of one of the plurality of second stage amplifiers to at least five threshold values, and wherein the comparator module is further configured to produce an output signal indicative of a level of the detected power signal relative to the at least five threshold values; and
a controller coupled to the comparator module, the first stage amplifier, and the plurality of second stage amplifiers, wherein the controller is configured to determine the rate of change of a gain of the first stage amplifier and the rate of change of a gain of each of the second stage amplifiers,
wherein the controller is further configured to produce a plurality of gain control signals to change the gain of one of the first stage amplifier or the plurality of second stage amplifiers at a plurality of asymmetric rates so as to cause the power of the output signal to move toward one of said at least five threshold values.

13. The system of claim 12, wherein the controller is configured to:
increase the gain at a first rate when the comparator module indicates the detected power level is in a low level identified for correction; and
decrease the gain at a second rate when the comparator module indicates the detected power level is in a high level identified for correction.

14. The system of claim 13, wherein the controller is further configured to select the first rate from a plurality of gain increase rates based on one or more conditions including the detected power level, the gain of the first stage amplifier, and the gain of the second stage amplifier.

15. The system of claim 13, wherein the controller is further configured to select the second rate from a plurality of gain decrease rates based on one or more conditions including the detected power level, the gain of the first stage amplifier, and the gain of the second stage amplifier.

16. The system of claim 12, wherein:
the first stage amplifier is a variable gain amplifier having a gain programmable by one or more gain control signals; and
each second stage amplifier is a variable gain amplifier having a gain programmable by one or more gain control signals.

* * * * *